United States Patent
Im

(10) Patent No.: US 7,161,839 B2
(45) Date of Patent: Jan. 9, 2007

(54) NON-VOLATILE MEMORY DEVICE AND PROGRAM METHOD THEREOF

(75) Inventor: Jae-Woo Im, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 20 days.

(21) Appl. No.: 11/025,016

(22) Filed: Dec. 28, 2004

(65) Prior Publication Data

US 2006/0067131 A1    Mar. 30, 2006

(30) Foreign Application Priority Data

Sep. 30, 2004    (KR) ................ 10-2004-0077926

(51) Int. Cl.
*G11C 11/34*    (2006.01)
(52) U.S. Cl. .................. 365/185.28; 365/185.28
(58) Field of Classification Search ............ 365/185.28
See application file for complete search history.

(56) References Cited

U.S. PATENT DOCUMENTS 5,267,190 A * 11/1993 Easley et al. .............. 365/49
6,259,628 B1 * 7/2001 Park ..................... 365/185.22
6,362,990 B1 * 3/2002 Gibson et al. ............... 365/49

FOREIGN PATENT DOCUMENTS

| JP | 2000-149578 | 5/2000 |
| JP | 2002-279789 | 9/2002 |
| KR | 1997-050991 | 10/1997 |

OTHER PUBLICATIONS

English language abstract of Japanese Publication No. 2000-149578.
English language abstract of Japanese Publication No. 2002-279789.
English language abstract of Korean Publication No. 1997-050991.

* cited by examiner

*Primary Examiner*—Amir Zarabian
*Assistant Examiner*—Anthan Tran
(74) *Attorney, Agent, or Firm*—Marger Johnson & McCollom, P.C.

(57) ABSTRACT

A non-volatile memory device and a program method thereof are provided. Data is scanned to search data bits to be practically programmed. The searched data bits are simultaneously programmed as many times as a predetermined number. Since data scanning and programming are conducted using a pipeline processing, an average time required for programming data is effectively shortened.

15 Claims, 4 Drawing Sheets

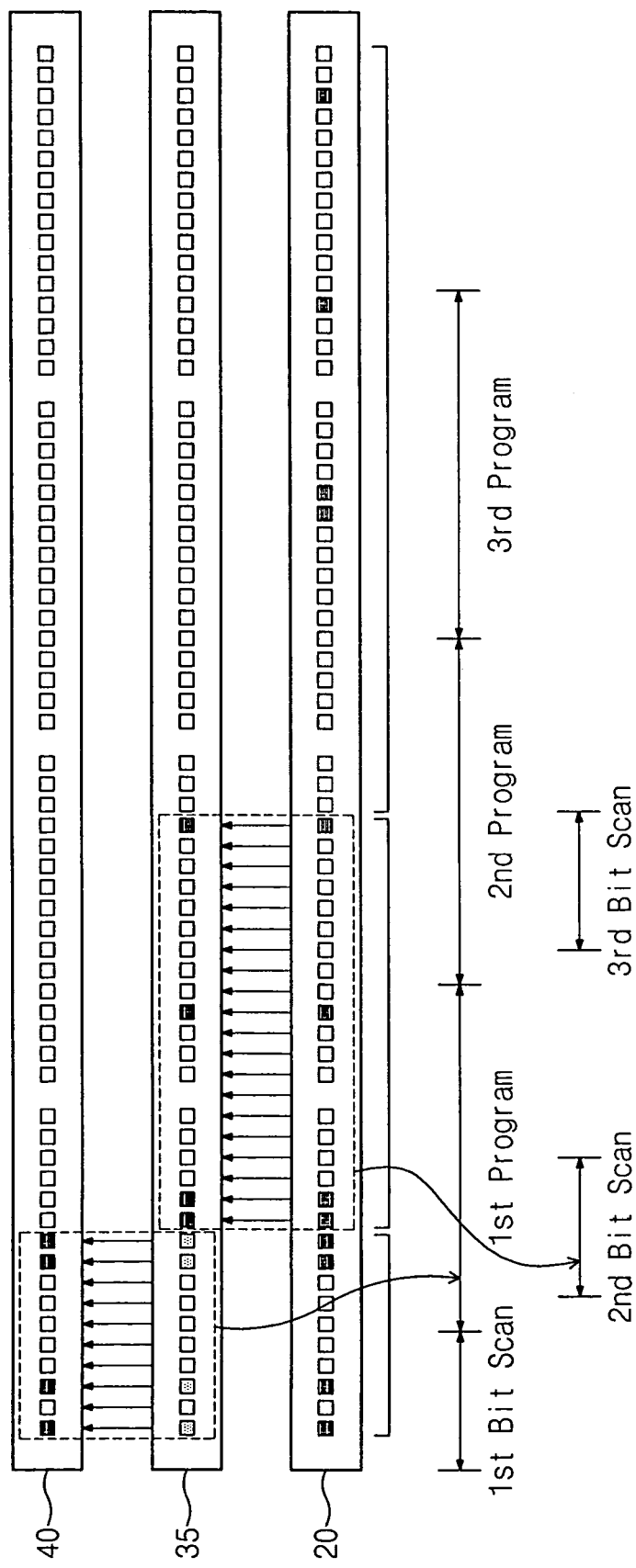

NON-VOLATILE MEMORY DEVICE AND PROGRAM METHOD THEREOF

PRIORITY STATEMENT

This application claims priority of Korean Patent Application No. 2004-77926, filed on Sep. 30, 2004 in the Korean Intellectual Property Office, the disclosure of which is incorporated herein in its entirety by reference.

BACKGROUND OF THE INVENTION

1. Field of the Invention

The invention relates to a non-volatile memory device and, more particularly, to a non-volatile memory device capable of shortening a program time.

2. Description of Related Art

Non-volatile memory devices, such as flash memories, continuously hold data stored in a cell even when their power supplies are interrupted. Typical flash memories can electrically erase cell data collectively. Therefore, flash memories are widely used in computers, memory cards and the like.

Flash memories are categorized into NOR-type and NAND-type according to their cell-bitline connecting configurations. In a NOR-type flash memory, at least two cell transistors are connected in parallel to a bitline and data is stored using channel hot electrons, and erased using Fowler-Nordheim tunneling (F-N tunneling). In a NAND-type flash memory, at least two cell transistors are connected in series to a bitline and data is stored and erased using F-N tunneling. With a large consumption of current, NOR-type flash memories are disadvantageous in high integration density. With the smaller consumption of cell current than NOR-type flash memories, NAND-type flash memories are advantageous in high integration density.

A cell array of a NOR-type flash memory includes a plurality of banks, each having a plurality of sectors, each having a plurality of memory cells. Generally, an erase operation of a NOR-type flash memory is executed by sectors and a program operation thereof is executed by words (or bytes).

In order to program data to a cell array of a NOR-type flash memory, a program command is input to the flash memory. A program address and program data are input to the flash memory. The input program address and program data are temporarily stored in a chip. A memory cell corresponding to the program address is selected. A program voltage corresponding to the program data is applied to a bitline, practically executing a program operation. After passing an internally predetermined program execution time, a verify operation is executed to verify whether the data is programmed to the selected memory cell. Such program and verify operations are iteratively executed until the data is normally programmed to the selected memory cell.

For hot channel electrons used to program a NOR-type flash memory, a high voltage of 4–6 volts is applied to a drain of a memory cell. Therefore, program current over a determined level is needed. Since the high voltage applied to the drain is generated through a charge pump constructed in a chip, the number of simultaneously programmed memories is just two to four. For example, if the number of simultaneously programmed bits is four, 16-bit data is divided by 4 bits and programmed to a memory cell four times.

A program characteristic of a flash memory will now be described in brief. In order to execute a program operation in a flash memory, a corresponding address section must be erased (i.e., a data value is made to be "0") beforehand. Therefore, a no-program operation is executed before programming desired data to erase an address section, even though, in a bit-by-bit perspective, this is redundant and a waste of time for desired data bits that are "0". Most flash memories uniformly assign a determined program time to each data group irrespective of the fact that a value of data to be programmed is "0" or "1". As a result, a determined time is required for programming data irrespective of a value of the program data. This presents an overall program time that is excessively long.

SUMMARY OF THE INVENTION

Exemplary embodiments of the invention are directed to a nonvolatile memory device capable of shortening a program time and a program method thereof. In an exemplary embodiment, the program method includes searching data bits to be programmed among input data-bits; and programming the searched data bits. While the searched data bits are programmed, data bits to be programmed next are searched from the other data bits.

In some embodiments, the programming and searching are performed using a pipeline processing.

In an exemplary embodiment, the non-volatile memory device includes a data scanning unit for searching data bits to be programmed among input data bits, and a write driver for programming the searched data bits.

In some embodiments, the non-volatile memory device further includes a control logic to control data input/output of the write driver and the data scanning unit.

In some embodiments, the non-volatile memory device further includes an input/output buffer to store the externally input data bits and provides the data bits to the data scanning unit.

In some embodiments, the data scanning unit includes a scan latch to receive a plurality of data bits to be used in the search from the input/output buffer and to store the received data bits.

In some embodiments, the data scanning unit searches the data bits to be programmed as many as the predetermined simultaneous program bit number, and the write driver programs the searched data bits by the program bit number.

In some embodiments, the data scanning unit provides the searched data bits and address data of the data bits to the write driver.

BRIEF DESCRIPTION OF THE DRAWINGS

FIG. 4 illustrates a bit scanning program procedure according to the invention and a program time required.

DETAILED DESCRIPTION OF THE INVENTION

A non-volatile memory device according to the invention scans data bits to be practically programmed among program data and programs the scanned data bits by predetermined bits. Such a program scheme is called a "bit scanning program scheme". Scanning data bits to be practically programmed and programming the scanned data bits selectively are conducted using a pipeline processing, effectively shortening an average time required for programming data.

In order to execute a program operation in a non-volatile memory device such as a flash memory, a corresponding address section must be erased (a data value is made to be "1") beforehand. Since a program operation executed in a non-volatile memory device is to convert data "1" into data "0", the fact that program data is "1" means desired data is programmed with an execution of a no program operation. Therefore, in the invention, only data of value "0" are scanned and programmed to effectively shorten a program time. Particularly, the scanning and programming are simultaneously conducted using a pipeline processing to further shorten the program time.

Figure 1:
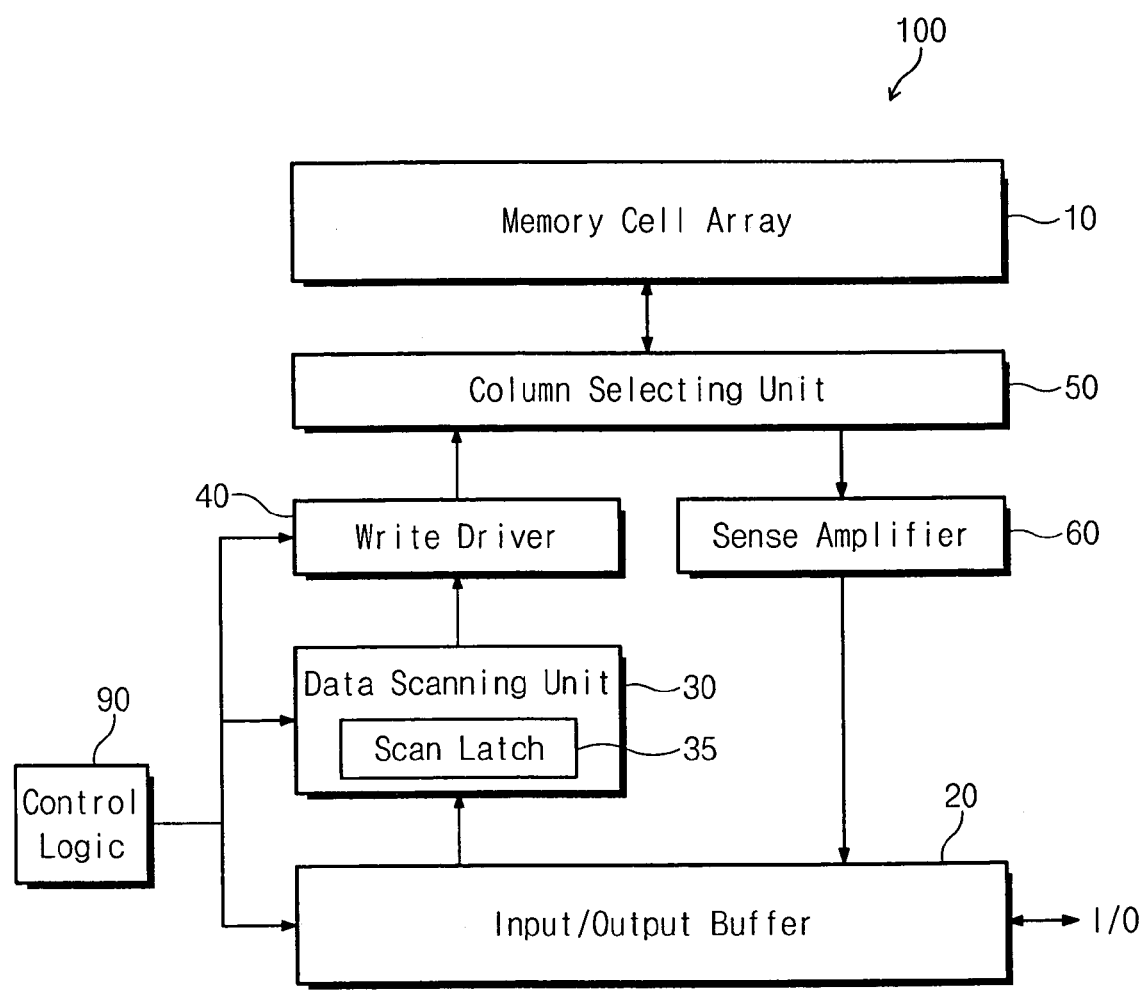
FIG. 1 is a block diagram of a semiconductor memory device according to the invention.

FIG. 1 illustrates a configuration of a semiconductor memory device 100 according to the invention.

A typical semiconductor memory device includes an array area having memory cells and peripheral circuits for selecting rows and columns of the array area. If the array area is divided into a plurality of array blocks, the peripheral circuits are also divided to correspond thereto. Such a configuration of an array area is well known to a person skilled in the art. In an array area that will be described more fully hereinafter, only an array block among a plurality of array blocks and peripheral circuits associated therewith (particularly peripheral circuits associated with a program operation) are illustrated. The semiconductor memory device 100 illustrated in FIG. 1 is exemplarily described with reference to a NOR-type flash memory. Nevertheless, a parallel bit scanning scheme according to the invention may be applied to other non-volatile memory devices.

As illustrated in FIG. 1, the semiconductor memory device 100 includes a memory cell array 10, an input/output buffer 20, a data scanning unit 30, a write driver 40, a column selecting unit 50, a sense amplifier 60, and a control logic 90.

The memory cell array 10 has NOR-type flash memory cells. The input/output buffer 20 stores data to be written to the memory cell array and data sensed from the memory cell array 10. The data scanning unit 30 scans data input from the input/output buffer 20 to search bits of value "0". If the number of the searched bits of value "0" reaches a predetermined simultaneous program bit number BitMax, the data scanning unit 30 transmits a corresponding data bit and address data to the write driver 40 in response to the control of the control logic 90. The simultaneous program bit number BitMax is the maximum number of bits that the write driver 40 can program simultaneously. The simultaneous program bit number BitMax may vary with a circuitry configuration. In the invention, the simultaneous program bit number BitMax of four bits will be exemplarily described.

The data scanning unit 30 has a scan latch 35 for performing a scan operation. The scan latch 35 stores data input from the input/output buffer 20. The data stored in the scan latch 35 is used in the scan operation of the scan latch 35. If bits of "0" are searched as many as the simultaneous program bit number BitMax or a scan operation is completed, the data scanning unit 30 transmits corresponding data bit and address to the write driver 40 in response to the control of the control logic 90. Preferably, the size of the scan latch 35 is smaller than the whole size of the input/output buffer 20. For example, if the input/output buffer 20 is configured to have a size of 32 words, the scan latch 35 may be configured to have a size of 8 words. The sizes of the input/output buffer 20 and the scan latch 35 may vary with a circuitry configuration.

The write driver 40 executes a program operation for the cell array 10 using the scan result input from the data scanning unit 30 (i.e., a predetermined-number of bits of data "0" and address data). A latch (not shown) is constructed in the write driver 40 to store data to be programmed (the data being received from the input/output buffer 20). The column selecting unit 50 selects a bitline (not shown; corresponding to the address data generated from the data scanning unit 30) of the cell array 10 to be programmed by the write driver 40.

During a program operation, the write driver 40 does not program all data but selectively programs only practically programmed data bits (i.e., data bits having a value "0") and does not program erase-state data bits (i.e., data bits having a value "1"). The number of bits which can be programmed simultaneously is called the simultaneous program bit number BitMax.

Although described in detail later, a scanning operation of the data scanning unit 30 and a program operation of the write driver 40 are simultaneously performed using a pipeline processing. For example, while the write driver 40 programs an (i-1)th scan result generated from the data scanning unit 30, the data scanning unit 30 performs an ith data scanning to search data for "0" to be programmed next. In this way, data scanning and programming operations are simultaneously performed to shorten the time required to program data.

After writing data to the memory cell array 10, the written data is sensed and amplified by the sense amplifier 60. After storing the sensed and amplified data in a corresponding address of the input/output buffer 20, the stored data is output to the outside. It is well known to a person skilled in the art that the data sensed and amplified by the sense amplifier 60 may be used to verify whether a program is pass or fail through a program verify unit (not shown). If the verify result is that the program is fail, the data is re-programmed. The bit scanning program scheme according to the invention may be applied to not only an initial program operation but also a re-program operation.

As previously stated, a data scanning operation for searching data bits to be practically programmed and a program operation relative to a scanned result are simultaneously performed using a pipeline processing. Thus, the time required for a program operation may be shortened.

Figure 2:
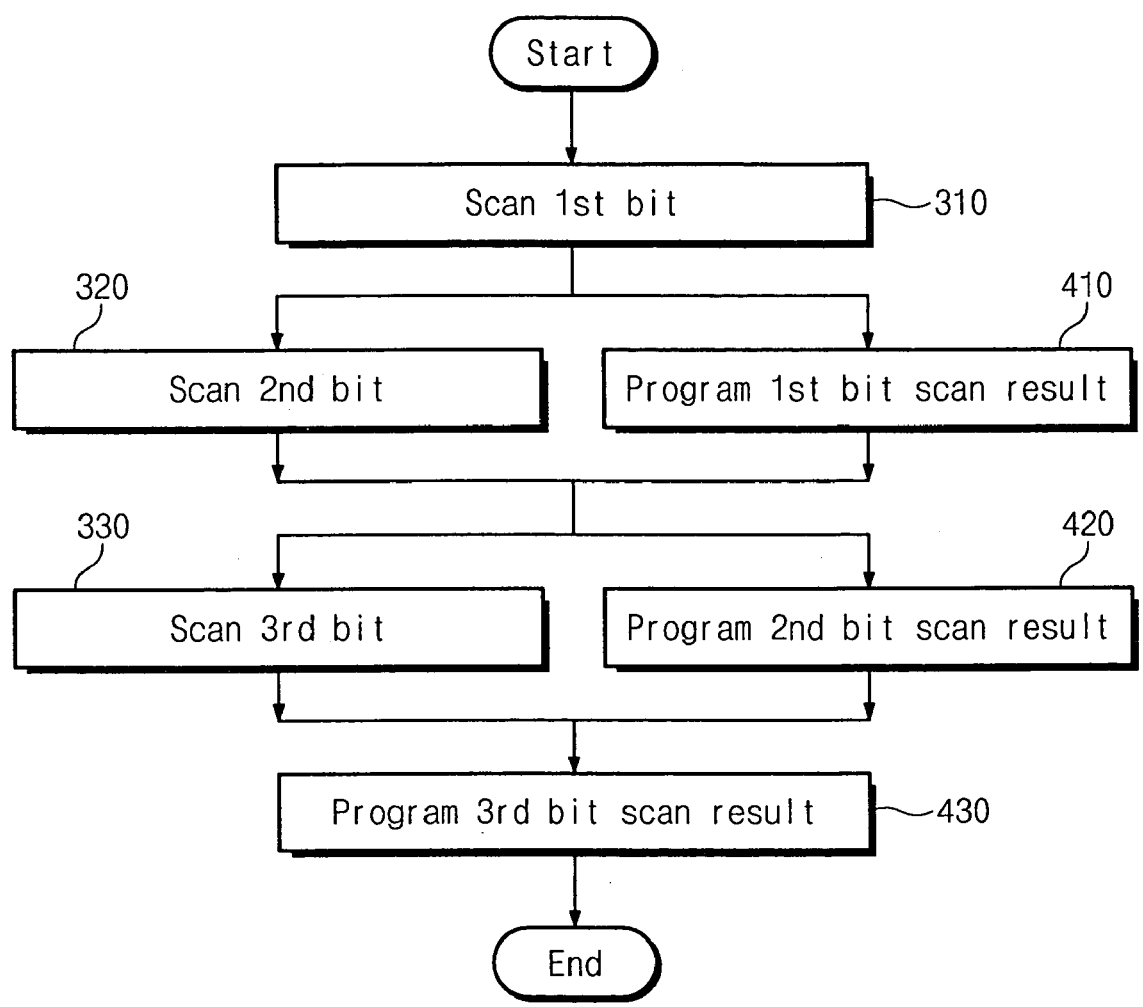
FIG. 2 is a flowchart of a program method according to the invention.

A flowchart of a program method according to the invention is illustrated in FIG. 2, in which the simultaneous program bit number BitMax is 4 and scan and program operations are performed three times. The times of the scan and program operations illustrated in FIG. 2 may vary with the simultaneous program bit number BitMax, a configuration of the scan latch 35, and so forth.

Referring to FIG. 2, a first bit is scanned through the data scanning unit 30 (step S310).

In step S310, the data scanning unit 30 stores data input from an input/output buffer 20 in a scan latch 35 in response to the control of the control logic 90. The data scanning unit 30 scans the data stored in the scan latch 35 to search data bits having a value "0". If the data bits of "0" are searched as many times as the simultaneous program bit number BitMax, the data scanning unit 30 transmits the searched data bits and address data to a write driver 40. In the invention, this procedure is called a bit scan operation.

After the first bit is scanned in step S310, the write driver 40 programs the predetermined-number data bits of "0"

(predetermined number being the simultaneous program bit number) obtained in the step S310 to a corresponding address of the memory cell array 10. While the first bit scan result is programmed in step S410, the data scanning unit 30 scans a second bit (step S320). The second bit scan operation step S320 is performed in the same manner as the first bit scan operation step S310. The first and second bit scan program operations performed in the steps S320 and S410 are simultaneously performed using a pipeline processing.

The write driver 40 programs a second bit scan result obtained in the step S320 (step S420). While the second bit scan result program operation is performed in the step S420, the data scanning unit 30 scans a third bit (step S330). The third bit scan operation S330 is also performed in the same manner as the first bit scan operation S310. The third and second bit scan result program operations performed in the steps S330 and S420 are simultaneously performed using a pipeline processing.

If data stored in the scan latch 35 of the data scanning unit 30 are all scanned due to the third bit scan operation performed in the step S330, the write driver 40 programs a third bit scan result obtained in the step S330. When such scan and program operations based on a pipeline processing are described, three-times scan and program operations are merely exemplary for convenience of description. With an increase of scan times and program times, the time required for a program operation may be shorter.

Figure 3:
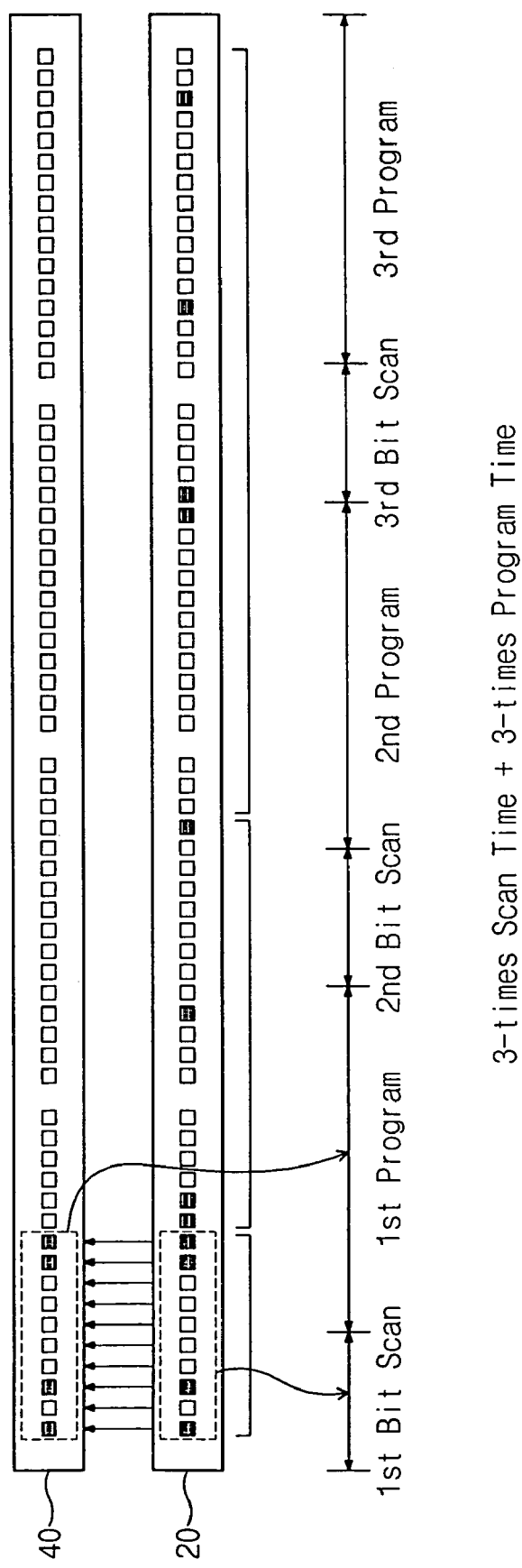
FIG. 3 illustrates a conventional bit scanning program procedure and a program time required.

FIG. 3 illustrates a conventional bit scanning program procedure and a program time required thereof, and FIG. 4 illustrates a bit scanning program procedure according to the invention and a program time required thereof. Numbers on the left in both FIGS. 3 and 4 refer to the element number in FIG. 1 that contains the respective data.

Referring to FIG. 3, a conventional bit scanning program scheme includes a data scanning procedure for searching data of "0" and a program procedure for programming the searched data bits, which are sequentially performed. Therefore, three times the scan time plus three times the program time are required to perform three times the scan and program operations.

As illustrated in FIG. 4, a bit scanning program scheme according to the invention includes a data scanning procedure for searching data of "0" and a program procedure for programming the searched data bits, which are performed using a pipeline processing. Thus, second and third data scanning procedures overlap first and second programming procedures, respectively. Accordingly, one scan time plus three times the program time are required to perform three times the scan and program operations. With an increase in the size of the data to be programmed, the program time may be further shortened.

As explained so far, the bit scanning method according to the invention includes a data scanning operation to search data bits to be practically programmed and a program operation to program a scanned result, which are performed using a pipeline processing. Thus, time required for a program operation may be greatly reduced.

Other modifications and variations to the invention will be apparent to a person skilled in the art from the foregoing disclosure. Thus, while only certain embodiments of the invention have been specifically described herein, it will be apparent that numerous modifications may be made thereto without departing from the spirit and scope of the invention.

What is claimed is:

1. A program method of a non-volatile memory device, comprising:

searching initial data bits to be programmed, among input data bits; and programming the searched initial data bits, wherein subsequent data bits to be programmed next are searched from other data bits while the searched initial data bits are programmed.

2. The program method as recited in claim 1, wherein the programming and searching are performed using a pipeline processing.

3. The program method as recited in claim 1, wherein the programming and searching comprise scanning and programming only data values of "0".

4. A non-volatile memory device comprising:

a data scanning unit to search initial data bits to be programmed, among input data bits; and a write driver to program the searched initial data bits, wherein subsequent data bits to be programmed next are searched from other data bits while the searched initial data bits are programmed.

5. The non-volatile memory device as recited in claim 4, wherein the programming and searching are performed using a pipeline processing.

6. The non-volatile memory device as recited in claim 4, wherein only data values of "0" are scanned by the data scanning unit to be subsequently programmed by the write driver.

7. The non-volatile memory device as recited in claim 4, further comprising a control logic to control data input/output of the write driver and the data scanning unit.

8. The non-volatile memory device as recited in claim 4, further comprising an input/output buffer to store the externally input data bits and to provide the data bits to the data scanning unit.

9. The non-volatile memory device as recited in claim 4, wherein the data scanning unit includes a scan latch to receive a plurality of data bits to be searched from the input/output buffer and to store the received data bits.

10. The non-volatile memory device as recited in claim 4, wherein the data scanning unit searches the data bits to be programmed as many times as a predetermined simultaneous program bit number.

11. The non-volatile memory device as recited in claim 10, wherein the data scanning unit provides the searched data bits and address data of the data bits to the write driver.

12. The non-volatile memory device as recited in claim 10, wherein the write driver programs the searched data bits by the predetermined simultaneous program bit number.

13. The program method as recited in claim 1, wherein the programming and searching comprise scanning and programming only data values of "1".

14. A program method of a non-volatile memory device, comprising:

erasing an address section by changing all data values in the address section to one of a "1" or a "0";

searching initial data bits to be programmed, among input data bits; and programming the searched initial data bits, wherein subsequent data bits to be programmed next are searched from other data bits while the searched initial data bits are programmed.

15. The program method as recited in claim 14, wherein the programming and searching comprise scanning and programming only data values of the other one of the "1" or the "0".

* * * * *